(12) United States Patent  (10) Patent No.: US 6,552,953 B2
Blodgett  (45) Date of Patent: Apr. 22, 2003

(54) HIGH SPEED SIGNAL PATH AND METHOD

(75) Inventor: Greg A. Blodgett, Nampa, ID (US)

(73) Assignee: Micron Technology, Inc., Boise, ID (US)

(*) Notice: Subject to any disclaimer, the term of this patent is extended or adjusted under 35 U.S.C. 154(b) by 161 days.

(21) Appl. No.: 09/777,835

(22) Filed: Feb. 5, 2001

(65) Prior Publication Data

US 2002/0122346 A1 Sep. 5, 2002

(51) Int. Cl.$^7$ .................................................. G11C 8/00
(52) U.S. Cl. .................... 365/233; 365/194; 365/198
(58) Field of Search ...................... 365/194, 76, 233, 365/77, 198, 233.5; 327/170, 277, 263; 326/93, 21

(56) References Cited

U.S. PATENT DOCUMENTS 5,519,344 A * 5/1996 Proebsting .................. 327/108
5,999,481 A * 12/1999 Cowles et al. ............... 365/233
6,137,849 A   10/2000 Humphrey .................. 375/354
6,331,793 B1  12/2001 Fletcher et al. .............. 327/51

* cited by examiner

Primary Examiner—Richard Elms
Assistant Examiner—Jung H. Hur
(74) Attorney, Agent, or Firm—Dorsey & Whitney, LLP

(57) ABSTRACT

A high speed data path includes a first plurality of inverters skewed toward one logic level alternating with a second plurality of inverters skewed toward a second logic level. As a result, the inverters in the first plurality accelerate one transition of a digital signal and the inverters in the second plurality accelerate the opposite transition of the digital signal. Prior to applying the digital signal to the inverters, the inverters are preset to a logic level from which they will transition in an accelerated manner. As a result, a transition of the digital signal is coupled through the inverters in an accelerated manner.

54 Claims, 7 Drawing Sheets

HIGH SPEED SIGNAL PATH AND METHOD

TECHNICAL FIELD

This invention relates to memory devices, and, more particularly, to a circuit and method for accelerating the propagation of signals in memory devices.

BACKGROUND OF THE INVENTION

The speed at which digital signals can propagate through integrated circuits, such as memory devices, is often a primary factor limiting the speed at which integrated circuits can operate. As the speed requirements of memory devices and other integrated circuits continues to increase, increasing the speed at which signals can propagate through conductive lines in integrated circuits has become increasingly important. The speed at which digital signals can propagate through signal lines is reduced as the capacitance and/or resistance of the lines increase. In general, both the capacitance and the resistance of a signal line are directly proportional to its length. Since the delay of a signal line is proportional to the product of capacitance and resistance, the delay of the signal line is proportional to the square of its length.

Another requirement of integrated circuits is increased density of semiconductor features. Increasing the density of semiconductor features inevitably results in a reduction in both the thickness of signal lines and the spacing between signal lines. However, reducing the thickness of signal lines increases their resistance, and reducing the spacing between signal lines increases their capacitance. As mentioned above, both increasing capacitance and increasing resistance reduce the propagation speed of signals through the signal lines. This problem is often exacerbated by the need to maintain the cross-sectional area of signal lines constant as their thickness decreases, thus requiring that the lines be made taller. Yet taller lines present a greater surface area to adjacent lines, thus further increasing the line capacitance. Thus, greater feature densities and faster operating speeds are, to some extent, mutually exclusive.

One area where the propagation of digital signals is particularly problematic is the coupling of data, address and control signals in memory arrays. Memory arrays must be very dense to provide acceptable memory capacities, thus making signal lines very thin and close together. The high density of memory arrays thus limits the speed at which data, address and control signals can propagate through memory arrays. Further, propagation delays are also increased by signals in adjacent lines transitioning in opposite directions. When a signal in one line transitions from low to high and a signal in an adjacent line transitions from high to low, for example, capacitive coupling of the transitions between the lines slows the propagation of both signals through their respective lines. Finally, the length of signal lines in memory arrays are relatively long, and a memory operation cannot be completed until the data, address and control signals have propagated to the farthest distance in the array.

It is well recognized that the propagation speed of one edge of a digital signal can be accelerated by coupling the signal through an inverter having "skewed" switching characteristics. A skewed inverter is designed so that it switches at a voltage level that is closer to one logic level than the other logic level. With reference to FIG. 1, an inverter 10 is formed by a PMOS transistor 12 and an NMOS transistor 14 coupled in series between a supply voltage $V_{CC}$, which is typically about 3 volts, and ground potential. When a input signal IN applied to the gates of the transistors 12, 14 is low, i.e., ground potential, the PMOS transistor 12 is turned ON and the NMOS transistor 14 is turned OFF, thereby producing a high, i.e., $V_{CC}$ level, output signal OUT. When the input signal is high, i.e., $V_{CC}$ level, the PMOS transistor 12 is turned OFF and the NMOS transistor 14 is turned ON, thereby producing a low, i.e., ground potential, output.

In a skewed inverter, one of the transistors 12, 14 is fabricated differently from the other of the transistors 12, 14. For example, the channel of one transistor 12, 14 may be fabricated with a channel that is wider or longer than the channel of the other one of the transistors 12, 14, the doping concentrations of the transistors 12, 14 may be different, or the transition voltage $V_T$ of the transistors 12, 14 may be different. In the case of the inverter 10 of FIG. 1, the NMOS transistor 14 has a channel that is wider than the channel of the PMOS transistor 14. As a result, the NMOS transistor 14 has a smaller resistance than the PMOS transistor 12 with the same gate-to-source voltage $V_{GS}$. The switching characteristics of the inverter 10 are shown in FIG. 2, using a voltage level of $V_{CC}$ equal to 3 volts, although other levels of VCC may be used. When the input signal IN is at 1.5 volts as it transitions from ground to 3 volts, the NMOS transistor 14 has a lower resistance than the PMOS transistor 12 because of its increased channel width. Consequently, the output signal OUT has already transitioned to ground potential. The output signal OUT has thus switched from high to low before the input signal IN has switched from low to high. The inverter 10 accelerates the input signal IN because the falling edge of the output signal OUT occurs before the rising edge of the input signal IN. If this phenomena was true for both the rising edge and the falling edge of the IN signal, a digital signal could be accelerated simply by connecting a number of skewed inverters in series. Unfortunately, such is not the case. With further reference to FIG. 2, when the input signal IN is at 1.5 volts as it transitions from 3 volts to ground, the NMOS transistor 14 continues to have a lower resistance than the PMOS transistor 12. As a result, the output voltage OUT remains at ground potential. The output signal OUT thus switches from low to high well after the input signal IN has switched from high to low. An inverter could be designed to accelerate the falling edge of the input signal IN by making the channel width of the PMOS transistor 12 greater than the channel width of the NMOS transistor 14. However, doing so would then delay the rising edge of the input signal IN. Thus, skewed inverters inherently accelerate one edge of a digital signal only at the expense of delaying the other edge of the digital signal. It is therefore apparent that skewed inverters alone cannot be used to accelerate digital signals in integrated circuits, such as memory devices.

SUMMARY OF THE INVENTION

A high speed signal path includes a first plurality of inverters skewed toward a first polarity of signal transition alternating with a second plurality of inverters skewed toward a second polarity of signal transition. As a result, each of the inverters in the first set accelerates a transition from a first logic level to a second logic level, and each of the inverters in the second set accelerates a transition from the second logic level to the first logic level. A pass gate preferably couples an input terminal to the first inverter in the series responsive to a control signal having a first value. A preset circuit presets the inverters to a logic level so that any subsequent transition of the inverters resulting from coupling a digital signal through the inverters will be accelerated. A pair of the high speed signal paths may be used to couple a digital signal and a clock signal to respective output terminals. By designing the high speed signal path for the digital signal with greater skew than the high speed signal path for the clock signal, the digital signal will be present at its output terminal for a period that encompasses the period that the clock signal is present at its output terminal. As a result, the clock signal can be used to designate a data valid period for the digital signal. The high speed signal path may be used in memory devices or other integrated circuits, and a memory device using one or more of the high speed signal paths may be used in a computer system.

DETAILED DESCRIPTION OF THE INVENTION

Figure 3:
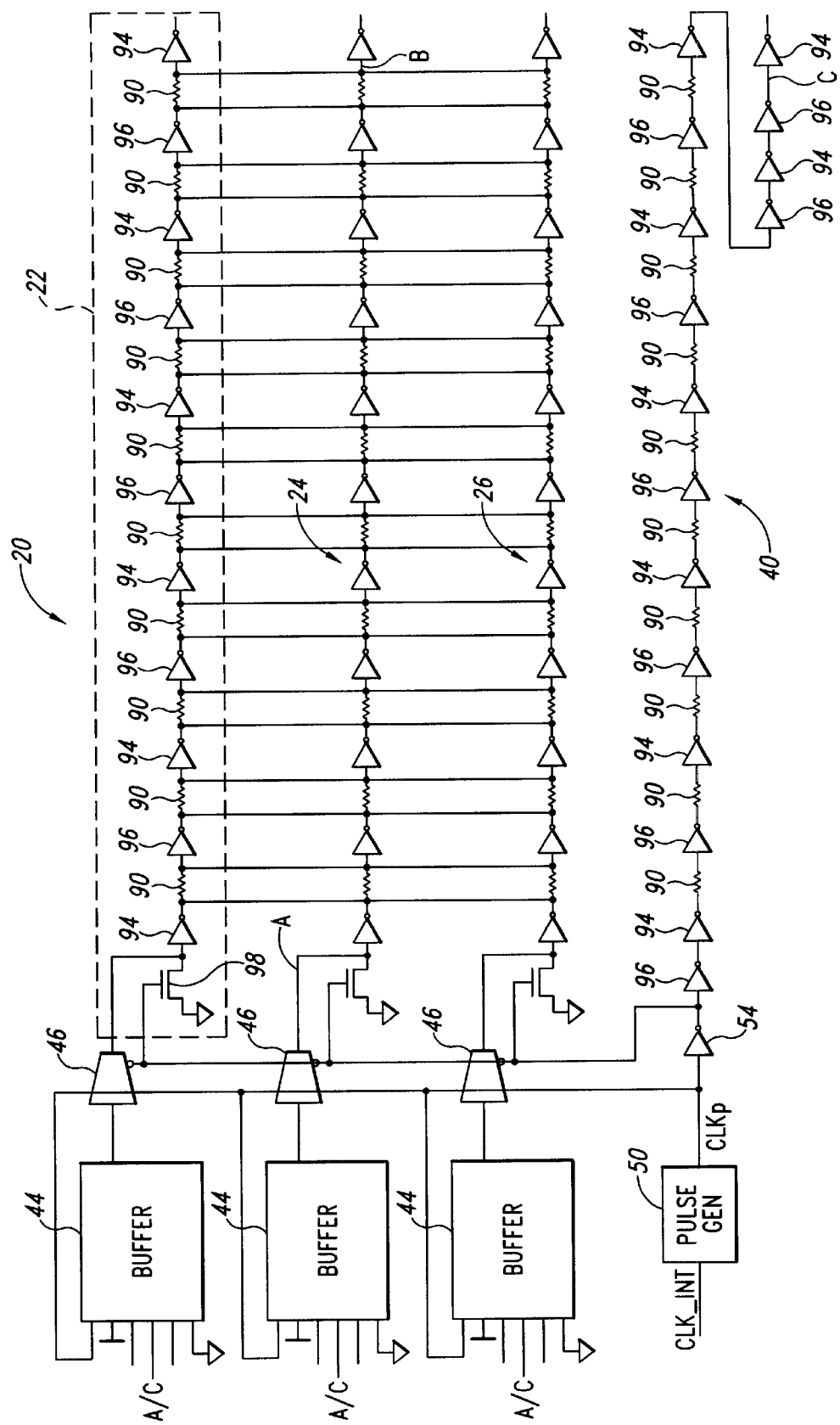
FIG. 3 is a logic diagram of a high speed signal propagation circuit in accordance with one embodiment of the invention.

One embodiment of a high speed signal propagation circuit 20 for accelerating the propagation of digital signals in a memory device is illustrated in FIG. 3. The circuit 20 includes a plurality of address/control signal paths 22, 24, 26 and a clock signal path 40. Each of the address/control paths 22, 24, 26 is driven by a respective buffer 44 through a respective pass gate 46. The pass gates 46 and the clock signal path 40 are driven by a pulse generator circuit 50 directly and though an inverter 54. The pulse generator circuit 50 generates a clock pulse $CLK_P$ on each rising edge of an internal clock signal CLK_INT. The $CLK_P$ signal is also coupled to a clock input of the buffers 44 to clock respective address or control signals out of the buffers 44.

Figure 4:
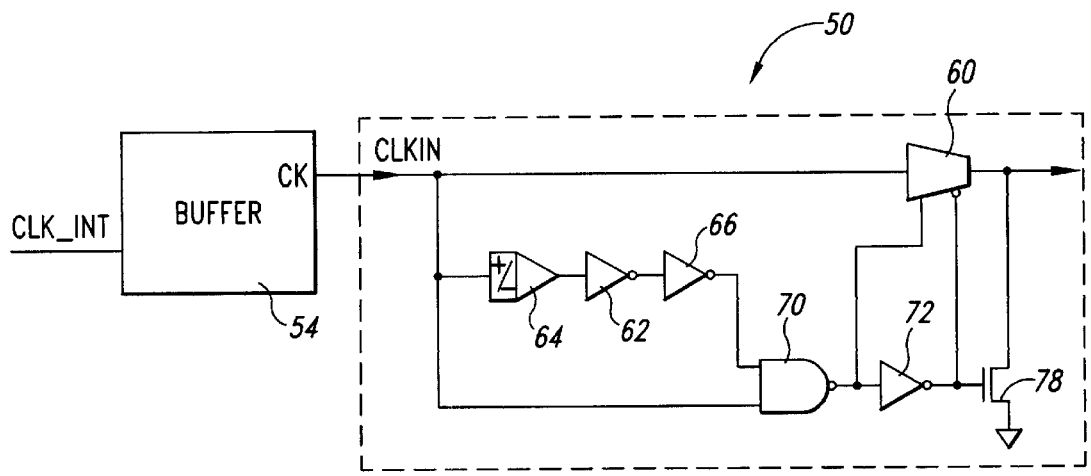
FIG. 4 is a logic diagram of one embodiment of a pulse generator used in the high speed signal propagation circuit of FIG. 3.

One embodiment of the pulse generator 50 is shown in FIG. 4. The pulse generator circuit 50 includes a buffer that receives the internal clock signal CLK_INT and outputs a corresponding CLKIN signal. The CLKIN signal is applied to a pass gate 60, to an inverter 62 receiving the CLKIN signal through a conventional time delay circuit 64, and to a NAND gate 70. The NAND gate 70 also receives the output of the inverter 62 through an inverter 66. When the CLKIN signal is low, the output of the NAND gate 70 is high. The high at the output of the NAND gate 70 and a low at the output of an inverter 72 that is coupled to the output of the NAND gate 70 enable the pass gate 60. As a result, the low CLKIN signal is coupled to the output of the pulse generator 50 to produce a low $CLK_P$ signal.

Figure 5:
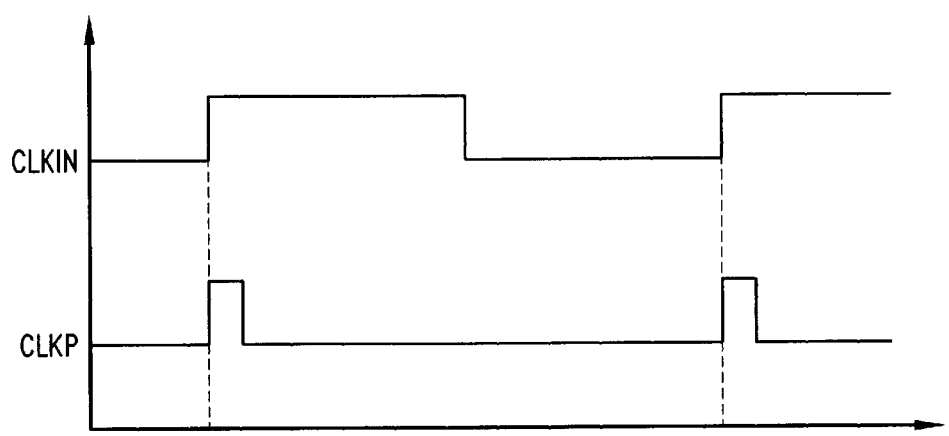
FIG. 5 is a timing diagram showing a pulsed clock signal generated by the pulse generator of FIG. 4 in response to a clock signal applied to the pulse generator.

When the CLKIN signal transitions high, its rising edge is immediately coupled through the enabled pass gate 60 so that the $CLK_P$ signal transitions high coincident with the rising edge of the CLKIN signal. The high CLKIN level is also coupled to the input of the NAND gate 70. However, the output of the inverter 66 remains low for a period corresponding to the delay of the time delay circuit 64 so that the output of the NAND gate 70 remains high to keep the pass gate 60 enabled. Upon the expiration of this delay period, both inputs of the NAND gate 70 are high, thereby causing the NAND gate 70 to output a low, which disables the pass gate 60. Further the low at the output of the NAND gate 70 causes the inverter 72 to output a high, thereby turning ON an NMOS transistor 78. The NMOS transistor 78 then couples the $CLK_P$ signal to ground. Thus, a high $CLK_P$ pulse is generated on each rising edge of the CLKIN signal for a duration determined by the delay of the time delay circuit 66, as shown in FIG. 5.

The falling edge of the CLKIN signal causes the NAND gate 70 to output a high, again enabling the pass gate 60 and turning OFF the NMOS transistor 78. The CLKIN signal is then coupled through the pass gate 60. However, since the CLKIN signal has transitioned low well before the NAND gate 70 has output a high, the high-to-low transition of the CLKIN signal has no effect on the output of the pulse generator 50. The $CLK_P$ signal from the pulse generator 50 therefore remains low until the next rising edge of the CLKIN signal, when another $CLK_P$ pulse is generated, as explained above.

Figure 1:
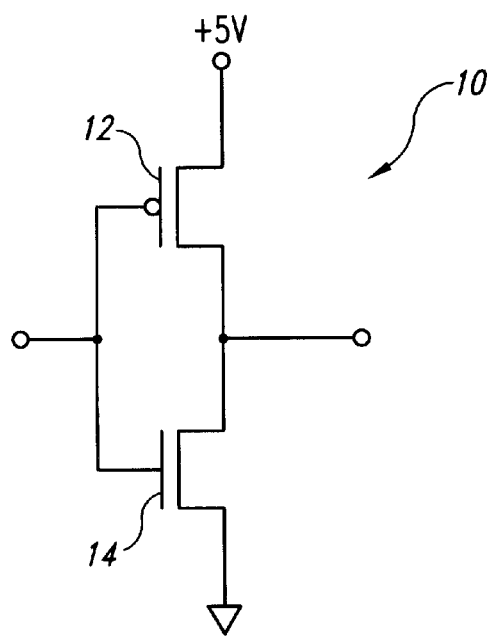
FIG. 1 is a schematic of a conventional inverter circuit.
Figure 2:
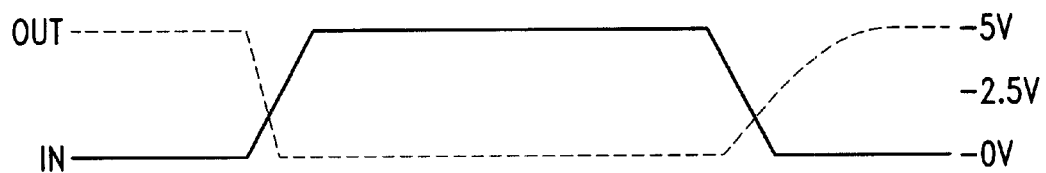
FIG. 2 is a timing diagram showing the switching response of the prior art inverter circuit of FIG. 1.

Returning to FIG. 3, all of the signal paths 22–26 and 40 are substantially identical to each other so, in the interest of brevity, the structure and operation of only the signal path 22 will be described. The signal path 22 includes a series of resistors 90 representing the distributed parasitic resistance and capacitance of a signal line. A first series of inverters 94 alternating with a second series of inverters 96 are placed at spaced apart locations in the signal line represented by the resistances 90. All of the inverters 94, 96 include a PMOS transistor (not shown) and an NMOS transistor (not shown) in the same configuration of the inverter 10 shown in FIG. 1. However, the NMOS transistors of the inverters 94 in the first series have a channel width that is greater than the channel width of the PMOS transistors in the inverters 94. As a result, the inverters 94 accelerate the rising edge and delay the falling edge of a digital signal applied to their respective inputs. The PMOS transistors of the inverters 96 in the second series have a channel width that is greater than the channel width of the NMOS transistors in the inverters 96. As a result, the inverters 96 accelerate the falling edge and delay the rising edge of a digital signal applied to their respective inputs.

By placing an inverter 94 at the front of the signal path 22 and then alternating the inverters 94, 96 thereafter, the signal path 22 greatly accelerates the rising edge of the pulsed input signal and greatly delays the falling edge of the pulsed input signal. A rising edge on the CLKp signal out of pulse generator 50 is used to latch an input signal out of input buffer 44, which is coupled to transmission gate 46. The high level of CLKp also enables the transmission gate 46 to pass the latched input signal to the input of the first inverter 94 of signal path 22. When the CLKp signal transitions low, the transmission gate 46 is disabled, and a signal path reset device 98 is turned on. Thus, a high pulse is generated at the input of the signal path 22 if the input to buffer 44 is high when CLKp transitions high. If the input to buffer 44 is low when the CLKp signal transitions high, then the input to the first inverter 94 is signal path 22 will remain low for that clock cycle. Thus, a high pulse input signal is generated only for high inputs, and the default signal level is the low reset level which is preasserted by the reset device 98 prior to the CLKp signal high transition.

By driving a predetermined default logic level through the transmission path prior to the occurrence of a valid input level out of buffer 44, more time is allowed for the default signal level to propagate though the transmission path. Now, only a non-default (in this case a high level) is required to have a fast propagation time through the transmission path when CLKp transitions high. The only requirement is that the reset low level must propagate through the transmission path 22 before the next CLKp propagates through transmission path 40 so that the output of transmission path 22 will be low for the next CLKp cycle if the input of butter 44 is not logic high level. By using a short pulse on the CLKp signal to pass the high level input through transmission path 22, and then resetting the path during the remainder of the CLKIN high time and the CLKIN low time, the default low state is guaranteed to have enough time to propagate through the transmission line 22.

In operation, when the $CLK_P$ signal is high to enable the pass gate 46, the low at the output of the inverter 54 turns OFF the NMOS transistor 98 so that the output of the buffer 44 can be applied to the first inverter 94 in the signal path 22. However, when the $CLK_P$ signal is low to disable the pass gate 46, the high at the output of the inverter 54 turns ON the transistor 98 so that the transistor 98 grounds the input to the first inverter 94 in the signal path 22. As a result, the inputs to all of the inverters 94 are preset to a low logic level, and the inputs to all of the inverters 96 are preset to a high logic level. Presetting the inverters 94, 96 to these logic levels has several effects. First, the inputs to all of the inverters 94, 96 are set to a logic level that causes them to transition with a polarity that will be accelerated by each of the inverters 94, 96. More particularly, the input to each of the inverters 94 is preset low so that, if the logic level of the signal from the buffer 44 causes the inverters 94, 96 to switch logic levels, their inputs will switch from low to high, which is the transition that is accelerated by the inverters 94. Similarly, the input to each of the inverters 96 is preset high so that, if the logic level of the signal from the buffer 44 causes the inverters 94, 96 to switch logic levels, their inputs will switch from high to low, which is the transition that is accelerated by the inverters 96. Thus, the NMOS transistor 98 presets all of the inverters 94, 96 to a logic level from which a subsequent transition will be accelerated.

Another advantage to presetting the inverters 94, 96 as described above is that none of the signals propagating through the signal paths 22–26 have adjacent sections that change logic levels in opposite directions. As mentioned above, the propagation delay of signals are increased if adjacent signals are transitioning in opposite directions. As a result of presetting the inputs to the inverters 94, 96, only some of the signal paths 22–26 will be switched. For example, if a signal applied to the path 24 by the buffer 44 is high, all of the inverters 94, 96 in the signal path 24 will be switched. If the respective signals applied to the paths 22, 26 by the respective buffer 44 are low, none of the inverters 94, 96 in the signal paths 22, 26 will be switched. As a result, there will be no capacitive coupling between signal transitions in one path and opposite signal transitions in an adjacent path. More specifically, a segment of one signal path transitioning from low to high will not be adjacent a segment of another signal path transitioning from high to low, and vice-versa. In a worst case, a transition in a segment of one signal path will be adjacent a segment of another signal path that is not transitioning. The lack of any opposite transitions in adjacent segments further minimizes the delay of coupling signals through the signal paths 22–26.

The magnitude of the acceleration provided by the inverters 94, 96 is a function of the number of inverters 94, 96 used in the signal path 22. As mentioned above, the propagation delay of the signal path 22 is proportional to the product of the capacitance and resistance of the signal path 22, both of which are directly proportional to its length. By breaking the signal path 22 into several sections and inserting the inverters 94, 96 between each section, the propagation delays are reduced from the square of the signal path length to the sum of the lengths of the various segments of the signal path. The result is a reduced propagation delay from the beginning to the end of the signal path 22–26. By accelerating the rising edge of a pulse signal, and slowing down the falling edge of that same pulse signal, the signal is effectively stretched. Therefore the output of the transmission path 22 is either low for a low input, or a high pulse for a high input, however, the high pulse output is wider than the high pulse input. The greater the skew on the inverters 94 and 96, the more the output pulse will be stretched, and the more the active edge (high in this example) will be accelerated. By skewing address, command and data lines more than clock lines, the address, command and data signals which are active for both high and low states can be designed to have valid pulse widths that are both accelerated more, and stretched more than the clock signal.

In one embodiment that will be shown and described below, the signal paths 22–26 are used in a memory device that uses a clock signal to define a data valid window of an address, data or control signal. In such cases, it is important to ensure that a Clock Load signal at the output of the clock signal path 40 is within the time that valid data is present at the outputs of the signal paths 22–26. If the Clock Load signal straddles the time that valid data are present at the outputs of the signal paths 22–26, spurious data may be registered by memory circuits (not shown in FIG. 3) that are coupled to the outputs of the signal paths 22–26.

Figure 6A:
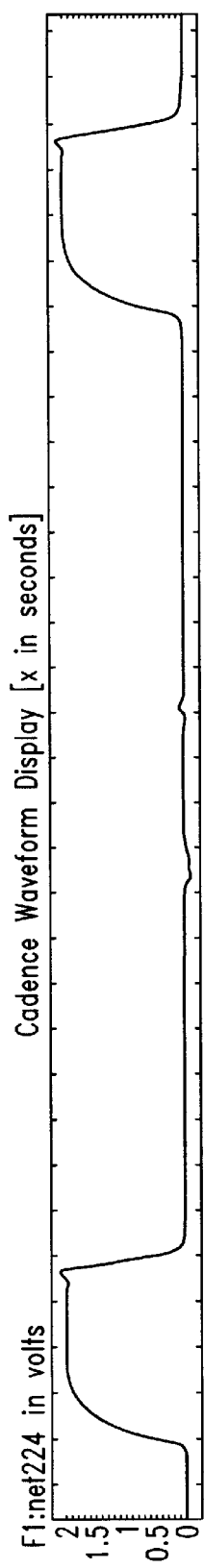
FIG. 6 is a timing diagram showing the timing relationship between a pulsed clock signal at the end of a clock signal path and an address/control signal at the end of a different signal path in the high speed signal propagation circuit of FIG. 3.
Figure 6B:
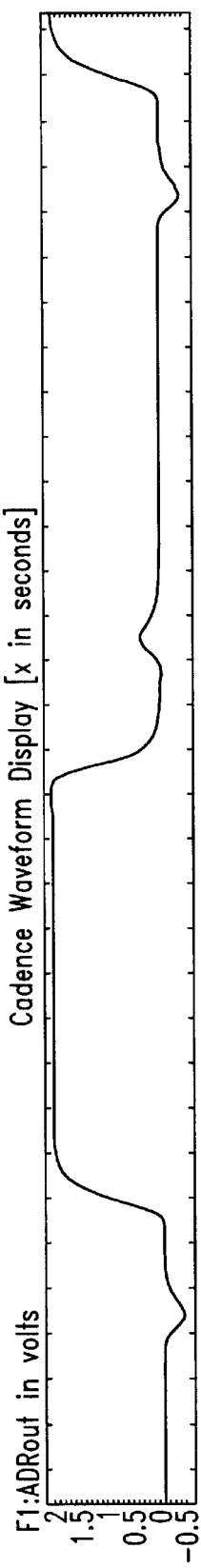
Figure 6C:
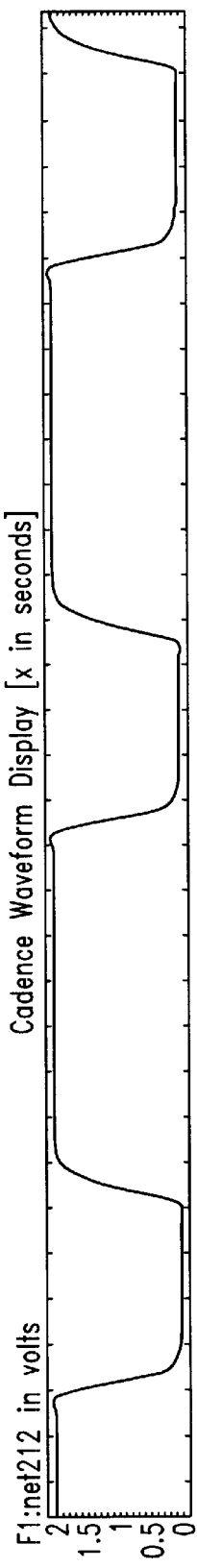

As shown in FIG. 6, the inverters 94, 96 in the clock signal path 40 are designed so they have less skew than the inverters 94, 96 in the other signal paths 22–26. As a result, the clock signal path 40 delays the leading edge of the $CLK_P$ signal to a greater extent than the other signal paths 22–26 delay the leading edges of the respective digital signals coupled through those paths 22–25. However, because of the lesser skew, the clock signal path 40 delays the trailing edge of the $CLK_P$ signal to a lesser extent than the other signal paths 22–26 delay the trailing edges of the respective digital signals coupled through those paths 22–25. By properly selecting the skew of the inverters 94, 96 in the clock signal path 40 in this manner, assurance can be provided that the valid periods of the digital signals from the signal paths 22–26 straddle the Clock Load signal.

Figure 7:
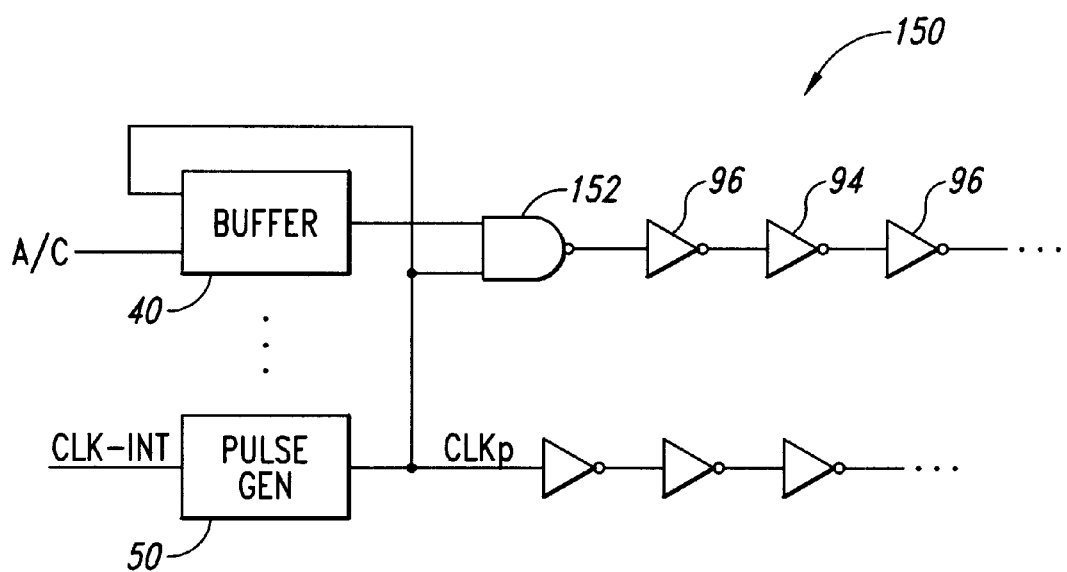
FIG. 7 is a logic diagram of a high speed signal propagation circuit in accordance with another embodiment of the invention.

An alternative embodiment of a high speed propagation circuit 150 according to another embodiment of the invention is shown in FIG. 7. The circuit 150 includes most of the same components used in the high speed signal propagation circuit 20 of FIG. 3 in the same arrangement. The circuit 150 differs from the circuit 20 by substituting a NAND gate 152 for the pass gates 46 and NMOS transistor 98 used in the high speed propagation circuit 20 of FIG. 3. When $CLK_P$ output of the pulse generator circuit 50 is low, the NAND gate 152 holds the input to the inverter 98 low to perform the same function performed by the transistor 98 in the circuit 20. When the CLK$_P$ output of the pulse generator circuit 50 is high, the NAND gate 152 is enabled to act as an inverter to perform the same function performed by the first inverter 96 in the circuit 20. As a result, the first inverter 96 in the series that is used in the circuit 20 is not needed. Although the high speed propagation circuit 150 is shown as being implemented with a NAND gate 152, it will be understood that other circuits, such as a NOR gate (not shown) may be used as long as the polarities of the signals applied to the gate are appropriately adjusted.

Figure 8:
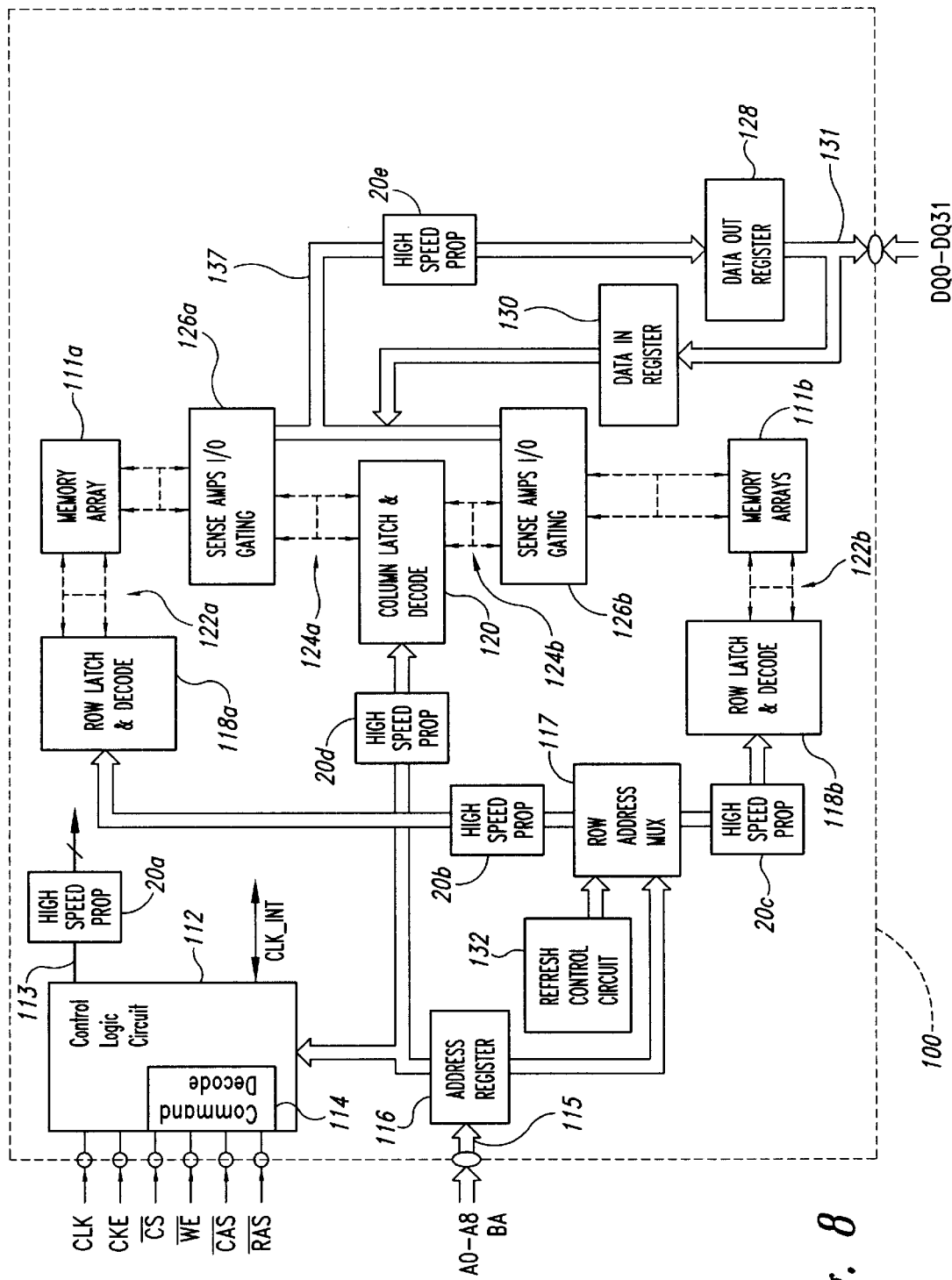
FIG. 8 is a block diagram of one embodiment of a memory device using several of the high speed signal propagation circuits of FIG. 3.

One embodiment of a memory device 100 that includes one or more of the high speed signal propagation circuits 20 is shown in FIG. 8. The memory device 100 is a synchronous dynamic random access memory (SDRAM) device that includes as its central memory element left and right banks of memory arrays 111A and 111B. Each of the memory arrays 111A and 111B includes a plurality of memory cells (not shown) arranged in rows and columns. A control logic circuit 112 controls the data transfer steps associated with a read or write access to the memory cells in the arrays 111A and 111B. In one embodiment, each of the arrays 111A and 111B has memory cells arranged in 512 rows by 256 columns by 32 bits. The memory device 110 has a width of 32 bits—meaning that each memory address (combined bank, row and column address) corresponds to a respective 32-bit memory cell in one of the arrays 111A and 111B, and a processor (not shown in FIG. 8) operates on data elements of 32 bits each. However, it will be understood that the memory device 100 may have a wide variety of other configurations.

A system clock (not shown) provides a CLK signal to the control circuit 112 of the memory device 10. Command signals are provided to the control circuit 112 and decoded by command decode circuitry 114. These signals are well known in the art, and include signals such as CKE (clock enable), $\overline{CS}$ (chip select), $\overline{WE}$ (write enable), $\overline{RAS}$ (row address strobe) and $\overline{CAS}$ (column address strobe). Distinct combinations of the various command signals constitute distinct processor commands. For example, the combination of $\overline{CS}$ low, $\overline{WE}$ high, $\overline{RAS}$ low and $\overline{CAS}$ high can represent an ACTIVE command. Examples of other well-known commands include READ, WRITE, NOP and PRECHARGE. Although the processor actually produces distinct command signals that in combination are registered and decoded as commands by the memory device 110, it is convenient to refer to these commands as being issued by the processor.

The control logic circuit 112 sends the internal clock CLK_INT signal as well as various control signals on control lines 113 to other parts of the memory device 100, corresponding to the processor-issued command. These control signals may control not only accesses to the memory cells in arrays 111A and 111B, but also a variety of other functions including the input of data to and output of data from the memory device 100. The length of the control lines 113 on which the control signal is routed may be fairly long, and they may be spaced close to each other. Consequently, the high speed signal propagation circuit 20a may be used to accelerate the coupling of control signals to various memory components, as shown in FIG. 8.

The memory device 100 is also provided with an address of the memory location to be accessed on a 10-bit wide address bus 115, including a bank address specified by address bit BA and a row or column address specified by address bits A0–A8. The address is input to an address register 116 which provides the address information to the control circuit 112, a row-address multiplexer 117, and a column-address latch and decode circuit 120.

In response to one or more control signals provided by the control circuit 112, the row-address multiplexer 117 multiplexes row address information and provides it to one of two row-address latch and decode circuits 118a and 118b corresponding to the respective memory banks 111a and 111b to be accessed. In response to one or more control signals provided by the control circuit 112, each of the row latch and decode circuits 118a and 118b takes a row address provided by the row-address multiplexer 117 and activates a selected row of memory cells (not shown) in the memory array 111a and 111b by selecting one of several row access lines 122a and 122b, respectively. Again, the lines coupling the row address multiplexer 117 to the row latch and decode circuits 118a,b may be fairly long and close together, thus reducing the propagation speed of address signals coupled through the lines. High speed signal propagation circuits 20b,c may therefore be used to accelerate the coupling of these address signals from the row address multiplexer 117 to the row latch and decode circuits 118a,b.

In response to one or more control signals provided by the control circuit 112, the column latch and decode circuit 120 takes a column address provided by the address register 116 and selects one of several column access lines 124a and 124b, each of which is coupled to one of the memory arrays 111a and 111b by one of two I/O interface circuits 126a and 126b, respectively. In response to one or more control signals provided by the control circuit 112, each of the I/O interface circuits 126a and 126b selects the 32 memory cells corresponding to the column location in an activated row. As with the lines from the row address multiplexer 117 to the column latch & decode circuits, the lines from the address register 116 to the column latch & decode circuit 120 may be long and/or close together. For this reason, the column address signals may be routed from address register 116 to the column latch & decode circuit 120 through a high speed signal propagation circuit 20d of the type shown in FIG. 3.

The I/O interface circuits 126a and 126b include sense amplifiers (not shown) which determine and amplify the logic state of the selected memory cells coupled to the sense amplifiers thorough respective pairs of complimentary digit lines (not shown). The I/O interface circuits 126a and 126b also include I/O circuits that gate data to 32 data output registers 128 and from a data input register 130, responsive to one or more control signals provided by the control circuit 112. Normally included in the I/O interface circuits 126a,b are DC sense amplifiers (not shown) that receive data from the digit line sense amplifiers and couple the data to the data out register 128. Again, the signal paths from the DC sense amplifier may be long and close together, thus making it desirable to couple the data signals through another of the high speed signal propagation circuits 20e. The data registers 128 and 130 are connected to a 32-bit wide data bus 31 at DQ pads DQ0–DQ31 to transfer output data Q0–Q31 to a processor and input data D0–D31 from a processor, responsive to one or more control signals provided by the control circuit 112. However, it will be understood that data having a greater or lesser number of bits may alternatively be coupled to or from the memory device 100.

The memory device 110 includes a refresh control circuit 132 which, responsive to one or more control signals provided by the control circuit 112, initiates regular and periodic activation of each of the rows of the memory cells in the arrays 111a and 111b for purposes of data refresh, as is well known in the art. In response to one or more control signals provided by the control circuit 112, a respective one of the I/O interface circuits A and B senses data stored in the memory cells of the refresh-activated row and rewrites values corresponding to the stored data in each of the memory cells.

Although several high speed signal propagation circuits 20a–e have been shown in the memory device 100 at specific locations, it will be understood that a fewer or greater number of high speed signal propagation circuits 20 may be used. Also, such high speed signal propagation circuits 20 may be used at different locations or in different types of memory devices or other digital circuits.

Figure 9:
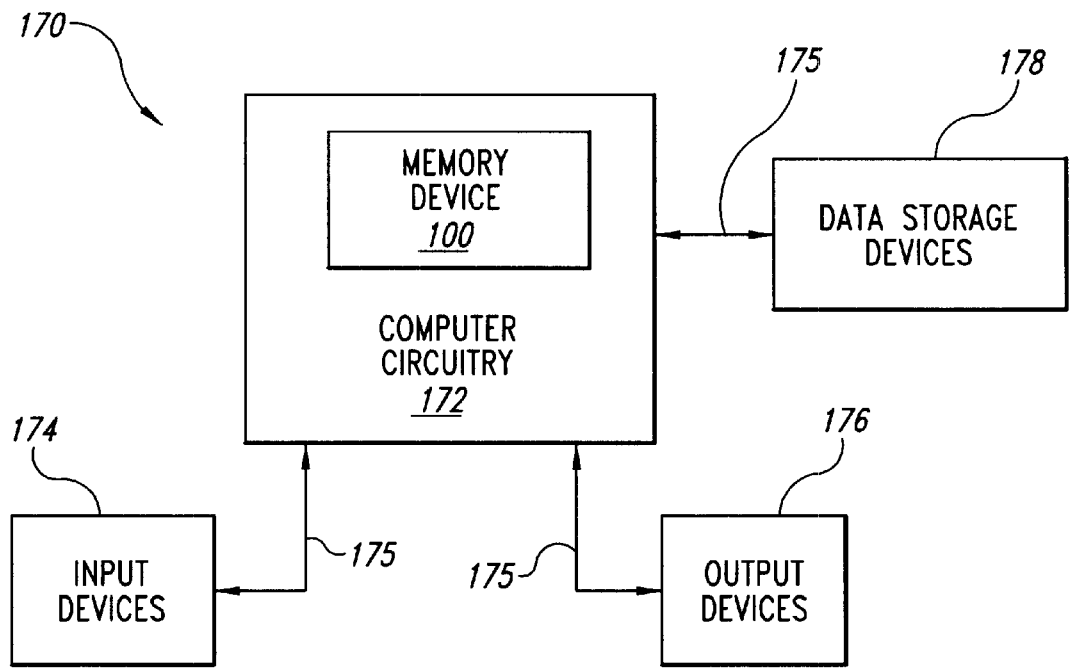
FIG. 9 is a block diagram of a computer system using the memory device of FIG. 8.

FIG. 9 is a block diagram of one embodiment of a computer system 170 using the memory device 100 of FIG. 8. The computer system 170 includes computer circuitry 172 for performing such computer functions as executing software to perform desired calculations and tasks. Circuitry 172 typically contains a processor (not shown) and the memory device 100 as shown. One or more input devices 174, such as a keyboard or a pointing device, is coupled to the computer circuitry 72 via a bus 175 and allows an operator (not shown) to manually input data thereto. One or more output devices 176 is coupled to the computer circuitry 172 via the bus 175 to provide to the operator data generated by the circuitry. Examples of output devices 176 include a printer and a video display unit. One or more data storage devices 178 is coupled to the computer circuitry 172 via the bus 175 to store data on or retrieve data from external storage media (not shown). Examples of storage devices 178 and associated storage media include drives that accept hard and floppy disks, magnetic tape recorders, and compact-disc read only memory (CD-ROM) readers.

It will be appreciated that, although embodiments of the invention have been described above for purposes of illustration, various modifications may be made without deviating from the spirit and scope of the invention. Accordingly, the invention is not limited except as by the appended claims.

What is claimed is:

1. A high speed signal path, comprising:
a first set of inverters, each of the inverters in the first set being skewed toward a first polarity of signal transition so that each of the inverters in the first set accelerates a transition from a first logic level to a second logic level;
a second set of inverters, each of the inverters in the second set being skewed toward a second polarity of signal transition, the second polarity being different from the first polarity so that each of the inverters in the second set accelerates a transition from the second logic level to the first logic level, the inverters in the first and second set being coupled in series with each other between an input node and an output node with the inverters in the first set alternating with the inverters in the second set; and
a logic circuit coupling an input terminal to the input node, the logic circuit being operative to couple the input terminal to the input node responsive to a control signal having a first value, and being operable to couple an input of one of the inverters to a reference voltage responsive to the control signal having a second value that is different from the first value, the reference voltage being a voltage corresponding the logic level from which the inverter accelerates a transition.

2. The high speed signal path of claim 1, further comprising a pulse generator structured to generate the control signal, the pulse generator being operative to generate the first value of the control signal responsive to a predetermined edge of a clock signal, the first value of the control signal being generated for a duration that is substantially shorter than the period of the clock signal.

3. The high speed signal path of claim 1, further comprising a pulse generator structured to generate the control signal, the pulse generator being operative to generate the second value of the control signal whenever the pulse generator is not generating a first value of the control signal, the second value of the control signal being generated responsive to a predetermined edge of a clock signal, the second value of the control signal being generated for a duration that is substantially shorter than half of the period of the clock signal.

4. The high speed signal path of claim 1, wherein the logic circuit comprises:
a pass gate coupling the input terminal to the input node, the pass gate being operative to couple the input terminal to the input node responsive to the first control signal having the first value; and
a switch coupling the input of one of the inverters to the reference voltage responsive to the second control signal having the first value, the first value of the second control signal being present when the first control signal has other than the first value, the reference voltage being a voltage corresponding the logic level from which the inverter accelerates a transition.

5. The high speed signal path of claim 4, wherein the switch is coupled to the input node.

6. The high speed signal path of claim 1, wherein the first control signal and the second control signal are compliments of each other, and wherein the logic circuit comprises a logic gate having a first input terminal coupled to the input terminal, a second input coupled to receive the first or second control signal, and an output terminal coupled to the input node.

7. A high speed propagation circuit, comprising:
a control circuit structured to alternately generate first and second values of a control signal;
a first high speed data path having a plurality of inverters coupled in series with each other between a first input node and a first output node, a plurality of the inverters being skewed toward a first polarity and alternating with a plurality of the inverters skewed toward a second polarity that is different from the first polarity, the first high speed data path further comprising a logic circuit operative to couple an input signal terminal to the first input node responsive to the first value of the control signal, the first high speed data path further comprising a first preset circuit operative to preset an input to one of the inverters to a logic level corresponding to a voltage from which the inverter is skewed to accelerate a transition, the input being preset responsive to the second value of the control signal; and
a second high speed data path having a plurality of inverters coupled in series with each other between a second input node and a second output node, a plurality of the inverters being skewed toward the first polarity and alternating with a plurality of the inverters skewed toward the second polarity, the second high speed data path further comprising a second logic circuit operative to couple an output of a pulse generator to the second input node responsive to the first value of the control signal, the second high speed data path further comprising a second preset circuit operative to preset an input to one of the inverters to a logic level corresponding to a voltage from which the inverter is skewed to accelerate a transition, the input being preset responsive to the second value of the control signal, the inverters in the second high speed data path collectively being skewed so that a signal applied to the input signal terminal of the first high speed data path is coupled to the first output node of the first high speed data path for a period that encompasses a period that a signal applied to the second input signal terminal of the second high speed data path is coupled to the second output node of the second high speed data path.

8. The high speed propagation circuit of claim 7, wherein the first and second preset circuits each comprise a respective switch coupling an input of one of the inverters to a reference voltage responsive to the second value of the control signal, the reference voltage being a voltage corresponding the logic level from which the inverter accelerates a transition.

9. The high speed propagation circuit of claim 8, wherein each of the switches is coupled to a respective one of the first and second input nodes of the respective first and second high speed data paths.

10. The high speed propagation circuit of claim 7, wherein the logic circuit comprises a pass gate.

11. The high speed propagation circuit of claim 7, wherein the logic circuit and the preset circuit comprises a logic gate.

12. The high speed propagation circuit of claim 7, wherein the control circuit comprises a pulse generator structured to generate the first value of the control signal responsive to a predetermined edge of a clock signal for a duration that is substantially shorter than the period of the clock signal, the pulse generator generating the second value of the control signal whenever the first value of the control signal is not being generated.

13. A high speed propagation circuit, comprising:
a first series of alternately skewed inverters coupled between a signal input node and a signal output terminal;
a second series of alternately skewed inverters coupled between a clock input node and a clock output terminal, the inverters in the second series being skewed in a manner causing a signal coupled to the first series of inverters to be present at the signal output terminal before and after a clock signal coupled to the second series of inverters is present at the clock output terminal; and
a preset circuit operative to preset the inverters in the first and second series to a logic level from which a transition will be accelerated.

14. The high speed propagation circuit of claim 13, further comprising:
a first pass gate coupling a signal input terminal to the signal input node, the pass gate being operative to couple the signal input terminal to the signal input node responsive to a control signal having a first value; and
a second pass gate coupling a clock input terminal to the clock input node, the second pass gate being operative to couple the clock input terminal to the clock input node responsive to the first value of the control signal.

15. The high speed propagation circuit of claim 13, wherein the preset circuit comprises:
a first switch coupling an input of one of the inverters in the first series to a reference voltage responsive to a second value of the control signal, the second value being different from the first value of the control signal, the reference voltage being a voltage corresponding the logic level from which the inverter accelerates a transition; and
a second switch coupling an input of one of the inverters in the second series to a reference voltage responsive to the second value of the control signal, the reference voltage being a voltage corresponding the logic level from which the inverter accelerates a transition.

16. The high speed propagation circuit of claim 15, wherein the first switch is coupled to the signal input node and the second switch is coupled to the clock input node.

17. The high speed propagation circuit of claim 13, wherein the preset circuit comprises a logic gate.

18. The high speed propagation circuit of claim 13, further comprising a control circuit controlling the operation of the preset circuit, the control circuit generating a control signal to cause the preset circuit to preset the inverters in the first and second series.

19. The high speed propagation circuit of claim 18, wherein the control circuit comprises a pulse generator structured to generate the control signal responsive to a predetermined edge of a clock signal for a duration that is substantially shorter than half of the period of the clock signal.

20. A synchronous memory device, comprising:
an address bus adapted to receive address signals;
a control bus adapted to receive control signals, including a clock signal;
a data bus adapted to receive and output data signals;
at least one a memory-cell array;
an address decoder coupled between the address bus and the memory-cell array;
a data path coupled between the memory-cell array and the data bus;
a control circuit coupled the control bus, the memory-cell array, the address decoder and the data path, the control circuit being operable to generate control signals to control the operation of the memory device in synchronism with the clock signal; and
a high speed signal path included in the memory device, the high speed signal path comprising:
a first set of inverters, each of the inverters in the first set being skewed toward a first polarity of signal transition so that each of the inverters in the first set accelerates a transition from a first logic level to a second logic level;
a second set of inverters, each of the inverters in the second set being skewed toward a second polarity of signal transition, the second polarity being different from the first polarity so that each of the inverters in the second set accelerates a transition from the second logic level to the first logic level, the inverters in the first and second set being coupled in series with each other between an input node and an output node with the inverters in the first set alternating with the inverters in the second set; and
a logic circuit coupling an input terminal to the input node, the logic circuit being operative to couple the input terminal to the input node responsive to a first control signal having a first value, and being operable to couple an input of one of the inverters to a reference voltage responsive to a second control signal having a first value, the first and second control signals being complements of each other, the first value of the second control signal being present when the first control signal has other than the first value, the reference voltage being a voltage corresponding the logic level from which the inverter accelerates a transition, the logic circuit including a logic gate having a first input terminal coupled to the input terminal, a second input coupled to receive the first or second control signal, and an output terminal coupled to the input node.

21. The synchronous memory device of claim 20, wherein the logic circuit comprises:
a pass gate coupling an input terminal to the input node, the pass gate being operative to couple the input terminal to the input node responsive to a first value of a control signal; and a preset circuit operative to preset an input to one of the inverters to a logic level corresponding to a voltage from which the inverter is skewed to accelerate a transition, the preset circuit presetting the input responsive to a second value of the control signal.

22. The synchronous memory device of claim 21, wherein the preset circuit comprises a switch coupling an input of one of the inverters to a reference voltage responsive to a second value of the control signal, the reference voltage being a voltage corresponding the logic level from which the inverter accelerates a transition.

23. The synchronous memory device of claim 22, wherein the switch is coupled to the input node.

24. The synchronous memory device of claim 20, further comprising a pulse generator structured to generate the control signal, the pulse generator being operative to generate the first value of the control signal responsive to a predetermined edge of a clock signal, the first value of the control signal being generated for a duration that is substantially shorter than half of the period of the clock signal.

25. A synchronous memory device, comprising:
an address bus adapted to receive address signals;
a control bus adapted to receive control signals, including an external clock signal;
a data bus adapted to receive and output data signals;
at least one a memory-cell array;
an address decoder coupled between the address bus and the memory-cell array;
a data path coupled between the memory-cell array and the data bus;
a control circuit coupled the control bus, the memory-cell array, the address decoder and the data path, the control circuit being operable to generate control signals to control the operation of the memory device in synchronism with the clock signal; and
a high speed signal path included in the memory device, the high speed signal path comprising:
a first series of alternately skewed inverters coupled between a signal input node and a signal output terminal;
a second series of alternately skewed inverters coupled between a clock input node and a clock output terminal, the inverters in the second series being skewed in a manner causing a signal coupled to the first series of inverters to be present at the signal output terminal before and after an internal clock signal derived from the external clock signal and coupled to the second series of inverters is present at the clock output terminal; and
a preset circuit operative to preset the inverters in the first and second series to a logic level from which a transition will be accelerated.

26. The synchronous memory device of claim 25, further comprising:
a first pass gate coupling a signal input terminal to the signal input node, the pass gate being operative to couple the signal input terminal to the signal input node responsive to a control signal having a first value; and
a second pass gate coupling a clock input terminal to the clock input node, the second pass gate being operative to couple the clock input terminal to the clock input node responsive to the first value of the control signal.

27. The synchronous memory device of claim 26, wherein the preset circuit comprises:
a first switch coupling an input of one of the inverters in the first series to a reference voltage responsive to a second value of the control signal, the second value being different from the first value of the control signal, the reference voltage being a voltage corresponding the logic level from which the inverter accelerates a transition; and
a second switch coupling an input of one of the inverters in the second series to a reference voltage responsive to the second value of the control signal, the reference voltage being a voltage corresponding the logic level from which the inverter accelerates a transition.

28. The synchronous memory device of claim 27, wherein the first switch is coupled to the signal input node and the second switch is coupled to the clock input node.

29. The synchronous memory device of claim 25, further comprising a control circuit controlling the operation of the preset circuit, the control circuit generating a control signal to cause the preset circuit to preset the inverters in the first and second series.

30. The synchronous memory device of claim 29, wherein the control circuit comprises a pulse generator structured to generate the control signal responsive to a predetermined edge of the internal clock signal for a duration that is substantially shorter than half of the period of the internal clock signal.

31. The synchronous memory device of claim 25, wherein the preset circuit comprises a logic gate.

32. A computer system, comprising:
a data input device;
a data output device;
a processor coupled to the data input and output devices; and
a synchronous memory device, comprising:
an address bus adapted to receive address signals;
a control bus adapted to receive control signals, including a clock signal;
a data bus adapted to receive and output data signals;
at least one a memory-cell array;
an address decoder coupled between the address bus and the memory-cell array;
a data path coupled between the memory-cell array and the data bus;
a control circuit coupled the control bus, the memory-cell array, the address decoder and the data path, the control circuit being operable to generate control signals to control the operation of the memory device in synchronism with the clock signal; and
a high speed signal path included in the memory device, the high speed signal path comprising:
a first set of inverters, each of the inverters in the first set being skewed toward a first polarity of signal transition so that each of the inverters in the first set accelerates a transition from a first logic level to a second logic level;
a second set of inverters, each of the inverters in the second set being skewed toward a second polarity of signal transition, the second polarity being different from the first polarity so that each of the inverters in the second set accelerates a transition from the second logic level to the first logic level, the inverters in the first and second set being coupled in series with each other between an input node and an output node with the inverters in the first set alternating with the inverters in the second set; and a logic circuit coupling an input terminal to the input node, the logic circuit being operative to couple the input terminal to the input node responsive to a first control signal having a first value, and being operable to couple an input of one of the inverters to a reference voltage responsive to a second control signal having a first value, the first and second control signals being complements of each other, the first value of the second control signal being present when the first control signal has other than the first value, the reference voltage being a voltage corresponding the logic level from which the inverter accelerates a transition, the logic circuit including a logic gate having a first input terminal coupled to the input terminal, a second input coupled to receive the first or second control signal, and an output terminal coupled to the input node.

33. The computer system of claim 32, wherein the logic circuit comprises:

a pass gate coupling an input terminal to the input node, the pass gate being operative to couple the input terminal to the input node responsive to a first value of a control signal; and a preset circuit operative to preset an input to one of the inverters to a logic level corresponding to a voltage from which the inverter is skewed to accelerate a transition, the preset circuit presetting the input responsive to a second value of the control signal.

34. The computer system of claim 33, wherein the preset circuit comprises a switch coupling an input of one of the inverters to a reference voltage responsive to a second value of the control signal, the reference voltage being a voltage corresponding the logic level from which the inverter accelerates a transition.

35. The computer system of claim 34, wherein the switch is coupled to the input node.

36. The computer system of claim 32, further comprising a pulse generator structured to generate the control signal, the pulse generator being operative to generate the first value of the control signal responsive to a predetermined edge of a clock signal, the first value of the control signal being generated for a duration that is substantially shorter than half of the period of the clock signal.

37. A computer system, comprising:

a data input device;

a data output device;

a processor coupled to the data input and output devices; and a synchronous memory device, comprising:
an address bus adapted to receive address signals;
a control bus adapted to receive control signals, including an external clock signal;
a data bus adapted to receive and output data signals;
at least one a memory-cell array;
an address decoder coupled between the address bus and the memory-cell array;
a data path coupled between the memory-cell array and the data bus;
a control circuit coupled the control bus, the memory-cell array, the address decoder and the data path, the control circuit being operable to generate control signals to control the operation of the memory device in synchronism with the clock signal; and
a high speed signal path included in the memory device, the high speed signal path comprising:
a first series of alternately skewed inverters coupled between a signal input node and a signal output terminal;
a second series of alternately skewed inverters coupled between a clock input node and a clock output terminal, the inverters in the second series being skewed in a manner causing a signal coupled to the first series of inverters to be present at the signal output terminal before and after an internal clock signal derived from the external clock signal and coupled to the second series of inverters is present at the clock output terminal; and
a preset circuit operative to preset the inverters in the first and second series to a logic level from which a transition will be accelerated.

38. The computer system of claim 37, further comprising:

a first pass gate coupling a signal input terminal to the signal input node, the pass gate being operative to couple the signal input terminal to the signal input node responsive to a control signal having a first value; and a second pass gate coupling a clock input terminal to the clock input node, the second pass gate being operative to couple the clock input terminal to the clock input node responsive to the first value of the control signal.

39. The computer system of claim 38, wherein the preset circuit comprises:

a first switch coupling an input of one of the inverters in the first series to a reference voltage responsive to a second value of the control signal, the second value being different from the first value of the control signal, the reference voltage being a voltage corresponding the logic level from which the inverter accelerates a transition; and a second switch coupling an input of one of the inverters in the second series to a reference voltage responsive to the second value of the control signal, the reference voltage being a voltage corresponding the logic level from which the inverter accelerates a transition.

40. The computer system of claim 39, wherein the first switch is coupled to the signal input node and the second switch is coupled to the clock input node.

41. The computer system of claim 37, further comprising a control circuit controlling the operation of the preset circuit, the control circuit generating a control signal to cause the preset circuit to preset the inverters in the first and second series.

42. The computer system of claim 41, wherein the control circuit comprises a pulse generator structured to generate the control signal responsive to a predetermined edge of the internal clock signal for a duration that is substantially shorter than half of the period of the internal clock signal.

43. The computer system of claim 37, wherein the preset circuit comprises a logic gate.

44. A method of designating the validity of a digital signal, comprising:

coupling the digital signal through a first series of inverters in a manner that accelerates a first transition of the digital signal and delays a second transition of the digital signal;

coupling a clock signal through a second series of inverters in a manner that accelerates a first transition of the clock signal and delays a second transition of the clock signal, the transitions of the clock signal being delayed and accelerated to a lesser degree than the transitions of the digital signal are accelerated and delayed, respectively; and designating the digital signal at the output of the first series of inverters as being valid when the clock signal is being output from the second series of inverters.

45. The method of claim 44, further comprising presetting the inverters in the first and second series to a logic level from which they will transition in an accelerated manner prior to coupling the digital signal and the clock signal through the first and second series of inverters, respectively.

46. A high speed signal path, comprising:
a first set of inverters, each of the inverters in the first set being skewed toward a first polarity of signal transition so that each of the inverters in the first set accelerates a transition from a first logic level to a second logic level;
a second set of inverters, each of the inverters in the second set being skewed toward a second polarity of signal transition, the second polarity being different from the first polarity so that each of the inverters in the second set accelerates a transition from the second logic level to the first logic level, the inverters in the first and second set being coupled in series with each other between an input node and an output node with the inverters in the first set alternating with the inverters in the second set; and
a logic circuit coupling an input terminal to the input node, the logic circuit being operative to couple the input terminal to the input node responsive to a first control signal having a first value, and being operable to couple an input of one of the inverters to a reference voltage responsive to a second control signal having a first value, the first value of the second control signal being present when the first control signal has other than the first value, the reference voltage being a voltage corresponding the logic level from which the inverter accelerates a transition; and
a pulse generator structured to generate the second control signal, the pulse generator being operative to generate the first value of the second control signal whenever the pulse generator is not generating a second value of the second control signal, the second value of the second control signal being generated responsive to a predetermined edge of a clock signal, the second value of the second control signal being generated for a duration that is substantially shorter than half of the period of the clock signal.

47. The high speed signal path of claim 46, further comprising a pulse generator structure to generate the first control signal, the pulse generator being operative to generate the first value of the first control signal responsive to a predetermined edge of a clock signal, the first value of the first control signal being generated for a duration that is substantially shorter than the period of the clock signal.

48. The high speed signal path of claim 46, wherein the logic circuit comprises:
a pass gate coupling the input terminal to the input node, the pass gate being operative to couple the input terminal to the input node responsive to the first control signal having the first value; and
a switch coupling the input of one of the inverters to the reference voltage responsive to the second control signal having the first value, the first value of the second control signal being present when the first control signal has other than the first value, the reference voltage being a voltage corresponding the logic level from which the inverter accelerates a transition.

49. The high speed signal path of claim 48 wherein the switch is coupled to the input node.

50. The high speed signal path of claim 46 wherein the first control signal and the second control signals are complements of each other, and wherein the logic circuit comprises a logic gate having a first input terminal coupled to the input terminal, a second input coupled to receive the first or second control signal, and an output terminal coupled to the input node.

51. A high speed signal path, comprising:
a first set of inverters, each of the inverters in the first set being skewed toward a first polarity of signal transition so that each of the inverters in the first set accelerates a transition from a first logic level to a second logic level;
a second set of inverters, each of the inverters in the second set being skewed toward a second polarity of signal transition, the second polarity being different from the first polarity so that each of the inverters in the second set accelerates a transition from the second logic level to the first logic level, the inverters in the first and second set being coupled in series with each other between an input node and an output node with the inverters in the first set alternating with the inverters in the second set; and
a logic circuit coupling an input terminal to the input node, the logic circuit being operative to couple the input terminal to the input node responsive to a first control signal having a first value, and being operable to couple an input of one of the inverters to a reference voltage responsive to a second control signal having a first value, the first and second control signals being complements of each other, the first value of the second control signal being present when the first control signal has other than the first value, the reference voltage being a voltage corresponding the logic level from which the inverter accelerates a transition, the logic circuit including a logic gate having a first input terminal coupled to the input terminal, a second input coupled to receive the first or second control signal, and an output terminal coupled to the input node.

52. The high speed signal path of claim 51, further comprising a pulse generator structured to generate the first control signal, the pulse generator being operative to generate the first value of the first control signal responsive to a predetermined edge of a clock signal, the first value of the first control signal being generated for a duration that is substantially shorter than the period of the clock signal.

53. The high speed signal path of claim 51, wherein the logic circuit comprises:
a pass gate coupling the input terminal to the input node, the pass gate being operative to couple the input terminal to the input node responsive to the first control signal having the first value; and
a switch coupling the input of one of the inverters to the reference voltage responsive to the second control signal having the first value, the first value of the second control signal being present when the first control signal has other than the first value, the reference voltage being a voltage corresponding the logic level from which the inverter accelerates a transition.

54. The high speed signal path of claim 53 wherein the switch is coupled to the input node.

* * * * *

UNITED STATES PATENT AND TRADEMARK OFFICE
CERTIFICATE OF CORRECTION

PATENT NO. : 6,552,953 B2
DATED : April 22, 2003
INVENTOR(S) : Greg A. Blodgett

It is certified that error appears in the above-identified patent and that said Letters Patent is hereby corrected as shown below:

Column 2,
Line 23, reads "of VCC may be used." should read -- of $V_{CC}$ may be used --

Column 4,
Line 17, reads "Further the low at the" should read -- Further, the low at the --

Column 5,
Line 5, reads "is signal path 22" should read -- in signal path 22 --

Column 8,
Lines 34 and 35, reads "latch & decode" should read -- latch and decode --
Line 43, reads "pairs of complimentary" should read -- pairs of complementary --

Column 9,
Line 64, reads "corresponding the logic" should read -- corresponding to the logic --

Column 10,
Line 33, reads "signal are compliments" should read -- signal are complements --

Column 11,
Line 27, reads "circuit comprises a logic" should read -- circuit comprise a logic --

Column 12,
Line 31, reads "at least one a memory-cell" should read -- at least one memory-cell --
Line 36, reads "circuit coupled the control" should read -- circuit coupled to the control --

Column 13,
Line 38, reads "at least one a memory-cell" should read -- at least one memory-cell --
Line 44, reads "coupled the control bus" should read -- coupled to the control bus --

Column 14,
Line 49, reads "at least one a memory-cell" should read -- at least one memory-cell --

Column 15,
Line 65, reads "at least one a memory-cell" should read -- at least one memory-cell --

Column 16,
Line 3, reads "circuit coupled the control" should read -- circuit coupled to the control --
Line 60, reads "system of claim 37, wherein" should read -- system of claim 25, wherein --

UNITED STATES PATENT AND TRADEMARK OFFICE
CERTIFICATE OF CORRECTION

PATENT NO. : 6,552,953 B2
DATED : April 22, 2003
INVENTOR(S) : Greg A. Blodgett

It is certified that error appears in the above-identified patent and that said Letters Patent is hereby corrected as shown below:

<u>Column 17,</u>
Line 41, reads "corresponding the logic" should read -- corresponding to the logic --

Signed and Sealed this

First Day of June, 2004

JON W. DUDAS
*Acting Director of the United States Patent and Trademark Office*